(12) United States Patent
Sung et al.

(10) Patent No.: US 7,781,755 B2
(45) Date of Patent: Aug. 24, 2010

(54) LIGHT EMITTING DIODE BY USE OF METAL DIFFUSION BONDING TECHNOLOGY AND METHOD OF PRODUCING SUCH LIGHT EMITTING DIODE

(75) Inventors: Ying-Che Sung, Dashi (TW); Chao-Hsin Wang, Dashi (TW); Yi-Hsiung Chen, Dashi (TW); Shih-Yu Chiu, Dashi (TW)

(73) Assignee: Arima Optoelectronics Corp., Taoyuan County (TW)

( * ) Notice: Subject to any disclaimer, the term of this patent is extended or adjusted under 35 U.S.C. 154(b) by 0 days.

(21) Appl. No.: 12/385,906

(22) Filed: Apr. 23, 2009

(65) Prior Publication Data

US 2009/0206362 A1    Aug. 20, 2009

Related U.S. Application Data

(62) Division of application No. 11/636,557, filed on Dec. 11, 2006, now Pat. No. 7,704,770.

(51) Int. Cl.
  *H01L 29/06* (2006.01)
(52) U.S. Cl. .................. 257/13; 257/14; 257/15; 257/22; 438/46; 438/34; 438/47; 438/455; 438/457; 438/481

(58) Field of Classification Search ............. 257/13–15, 257/22; 438/34, 46, 47, 455, 457–459, 479, 438/481, 795
See application file for complete search history.

(56) References Cited

U.S. PATENT DOCUMENTS

| 6,303,405 | B1 * | 10/2001 | Yoshida et al. | 438/46 |
| 2003/0164503 | A1 * | 9/2003 | Chen | 257/79 |
| 2004/0082158 | A1 * | 4/2004 | Whelan et al. | 438/606 |
| 2005/0200794 | A1 * | 9/2005 | Oohata | 349/141 |
| 2006/0113656 | A1 * | 6/2006 | Uang et al. | 257/690 |

* cited by examiner

*Primary Examiner*—Zandra Smith
*Assistant Examiner*—Telly D Green
(74) *Attorney, Agent, or Firm*—Rosenberg, Klein & Lee

(57) ABSTRACT

The main objective of present invention is to provide a manufacturing method of light emitting diode that utilizes metal diffusion bonding technology. AlInGaP light emitting diode epitaxial structure on a temporary substrate is bonded to a permanent substrate having a thermal expansion coefficient similar to that of the epitaxial structure, and then the temporary substrate is removed to produce an LED having a vertical structure and better performance. The other objective of the present invention is to provide a high performance LED that uses metal diffusion technology and wet chemical etching technology to roughen the LED surface in order to improve light extraction efficiency.

9 Claims, 6 Drawing Sheets

LIGHT EMITTING DIODE BY USE OF METAL DIFFUSION BONDING TECHNOLOGY AND METHOD OF PRODUCING SUCH LIGHT EMITTING DIODE

RELATED APPLICATIONS

This application is a Divisional patent application of application Ser. No. 11/636,557, filed on 11 Dec. 2006, now U.S. Pat. No. 7,704,770. The entire disclosure of the prior application Ser. No. 11/636,557, from which an oath or declaration is supplied, is considered a part of the disclosure of the accompanying Divisional application and is hereby incorporated by reference.

BACKGROUND OF THE INVENTION

1. Field of the Invention

The present invention relates generally to high-performance light emitting diodes, and more particularly to a method of using metal diffusion bonding technology as well as surface treatment process to improve light extraction efficiency.

2. Description of the Related Art

The MOCVD epitaxy technology has been applied in the production of high brightness Group III-V light emitting diodes (LEDs), which include aluminum indium gallium phosphide (AlInGaP, wavelength range: 560 nm~650 nm) LEDs and indium gallium nitride (InGaN, wavelength range: 380 nm~550 nm) LEDs. High brightness LEDs are employed extensively in the areas of indicating lamps, traffic lights, outdoors displays, special lighting, etc. The epitaxial growth of AlInGaP LED is usually grown on lattice-matched GaAs substrate in order to get good crystal quality. However, since the energy bandgap of GaAs substrate is less than the emission energy of LED, at least half of the emitted light will be absorbed by the light-absorbing GaAs substrate. Improved performance can be achieved by eliminating this light-absorbing GaAs substrate. There are several techniques for replacing this light-absorbing substrate by either a transparent substrate or an opaque substrate.

U.S. Pat. No. 5,376,580 issued to Fred A. Kish, et al in 1993 disclosed a semiconductor light emitting diode structure and manufacturing process as shown in FIG. 1, wherein a wafer bonding was performed at a high temperature and a high pressure (temperature >900° C., pressure >400 kg/cm$^2$) to bond the epitaxial LED layers 61 and the transparent GaP semiconductor substrate 60. The light-absorbing GaAs substrate can be removed either before or after the wafer bonding. To reduce the resistance at the wafer-bond interface, Fred A. Kish suggested that the bonding interface must have an InGaP layer as a bonding layer 62. Such bonding method is usually called fusion bonding. The fusion bonding process has the following drawbacks: (1) after the removal of the GaAs substrate, the remaining LED structure is very thin, e.g., ~50 µm, and therefore fragile and difficult to handle, so that it is difficult to maintain the integrity of the bonded wafer or achieve a high yield rate; and (2) it is necessary to align precisely the lattice direction of LED structure and the permanent transparent substrate during the wafer bonding process, otherwise the operating voltage of the LED will be high.

U.S. Pat. No. 6,797,987 B2 issued to Tzer-Perng Chen in 2003 disclosed a semiconductor LED structure as shown in FIG. 2. Epitaxial structure 100 was grown on a temporary light-absorbing GaAs substrate by MOCVD. Thereafter, an ohmic contact metal 112 was formed on the p-type contact layer (GaAsP, AlGaAs or GaP). Then, a transparent conducting oxide layer 114 and a metal reflective layer 116 were deposited for reflecting the light generated in the active layer 106. The transparent conducting oxide layer 114 also served the function of conducting currents, so as to provide a vertical LED chip structure. Further, a permanent substrate 120 such as Si, AlN, SiC, copper, or aluminum was bonded to epitaxial structure 100 by using the bonding layer 124 such as Au—Sn, Au—Si, Pb—Sn, Au—Ge, or In alloy. The principle is same as soldering. During the heat up, when temperature reaches the eutectic point or melting point of the metal alloy chosen, the bonding layer 124 melted. When temperature cooled down, the liquid metal alloy solidified, and bonded epitaxial structure 100 to the permanent substrate 120. Since the bonding layer 124 is melted during the pressurized bonding process, the pressure applied for the bonding process must be less than 15 kg/cm$^2$ to prevent the melted metal from being squeezed out during the bonding process. Such bonding method is called eutectic bonding. The eutectic points or melting points of some commonly used metal bonding layer are listed below:

| | Typical Eutectic Point or Melting Point |
|---|---|
| In | 156° C. |
| Au—20Sn | 276° C. |
| Au—3.2Si | 363° C. |
| Pb—61.9Sn | 183° C. |
| Au—12.5Ge | 381° C. |

Usually, the eutectic bonding is categorized as a low-temperature (Typ. <400° C.) and/or low-pressure (<15 kg/cm$^2$) wafer bonding. This method has the following drawbacks: (1) Since this kind of eutectic reactions is fast, it is not easy to control the thickness of the metal bonding layer after bonding; (2) It is likely to produce an intermetallic compound (IMC) which is a fragile material, and the IMC further deteriorates the bonding strength; and (3) The bonded wafer can not go through a temperature higher than the bonding temperature in the chip process steps following wafer bonding, otherwise, the metal bonding layer will be affected. Furthermore, the bonding strength is not strong enough to survive the long-term reliability test, which is essential for high brightness LED.

U.S. Pat. No. 6,900,473 B2 issued to Shunji Yoshitake et al in 2002 disclosed some manufacturing methods for roughening surface of LED epi-wafers as shown in FIG. 3. Most light generated in the active layer of LED will be trapped inside LED due to the difference of refractive indices between semiconductor LED material and air (or epoxy resin). The roughened LED surface is capable of reducing the total internal reflection between LED surface and air (or epoxy resin), and thus, enhancing the light extraction efficiency of LED. In the embodiments disclosed by Shunji Yoshitake, the roughened LED surface is manufactured either by reducing V/III ratio during the later part of the epitaxial MOCVD growth of upper cladding layer or by thermal etch after epi-growth. However, both methods cannot guarantee the uniformity of the surface roughness. Such limitation makes the implementation of the surface roughening process of AlInGaP light emitting devices difficult.

SUMMARY OF THE INVENTION

Therefore, the primary objective of present invention is to provide a manufacturing method of light emitting diode that utilizes metal diffusion bonding technology. AlInGaP light emitting diode epitaxial structure on a temporary substrate (GaAs) is bonded to a permanent substrate (such as GaP, GaAs, and Mo, etc) having a thermal expansion coefficient similar to that of the epitaxial structure, so as to produce an LED having a vertical structure and better performance.

The other objective of the present invention is to provide a high performance LED that uses metal diffusion technology and wet chemical etching technology to roughen the LED surface in order to improve light extraction efficiency.

In order to achieve the above mentioned objectives, a method of producing light emitting diode by the metal diffusion bonding technology comprising the steps of:

a) forming an AlInGaP LED epitaxial structure with a thickness less than 20 μm on a temporary substrate, and the LED epitaxial structure comprising a first confinement layer, an active light emitting layer and a second confinement layer sequentially deposited on the temporary substrate;

b) forming a patterned transparent insulating current block layer on part of the top surface of the second confinement layer;

c) forming an ohmic contact metal layer on the transparent insulating current block layer and the second confinement layer;

d) providing a conducting permanent substrate with a thickness of 75 μm~200 μm, and the permanent substrate having an ohmic contact metal layer deposited on both the upper surface and the lower surface of the permanent substrate;

e) using a metal diffusion bonding layer with a thickness less than 5 μm on both AlInGaP LED epitaxial structure and permanent substrate to perform the wafer diffusion bonding between AlInGaP LED epitaxial structure and permanent substrate under the following conditions: temperature of 400° C.~700° C. and a pressure of 50 kg/cm$^2$~500 kg/cm$^2$;

f) removing the temporary substrate; and g) forming an ohmic contact metal layer on the first confinement layer of the semiconductor LED epitaxial structure, and performing an annealing process at a temperature of 400° C.~600° C. such that the ohmic contact metal is diffused into the first confinement layer and formed discrete metal clusters therein, and performing wet chemical etches to remove part of the ohmic contact metal layer and some of the first confinement layer, and then using an ultrasonic cleaner to remove the etching residues to form a rough surface.

The light emitting diode produced in accordance with the above-mentioned method includes:

a) a conducting permanent substrate formed on a second conducting electrode;

b) an ohmic contact metal layer formed on the permanent substrate;

c) a metal diffusion bonding layer formed on the ohmic contact metal layer;

d) an ohmic contact metal layer formed on the metal diffusion bonding layer;

e) an AlInGaP semiconductor LED epitaxial structure formed on the ohmic contact metal layer, a rough surface being formed on the top of the first confinement layer of semiconductor LED epitaxial structure;

f) an insulating transparent current block layer with special pattern interposed between the ohmic contact metal layer and the second confinement layer of AlInGaP semiconductor epitaxial structure to maintain the reflectivity and control current flow; and g) a composite electrode that consists of a center bonding pad and a set of ohmic contacts of the first conducting type formed on a partial surface of the first confinement layer of AlInGaP semiconductor epitaxial structure to ensure the current flow path.

DETAILED DESCRIPTION OF THE PREFERRED EMBODIMENT

Figure 1:
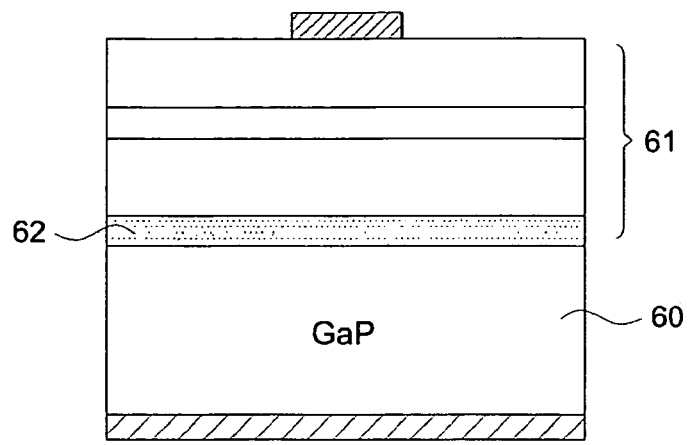
FIG. 1 is a cross-sectional view of an LED of U.S. Pat. No. 5,376,580.
Figure 2:
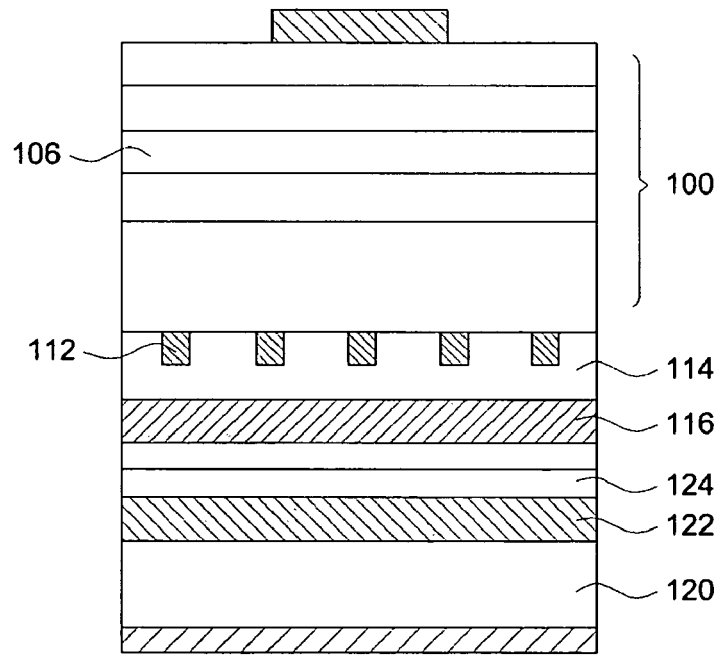
FIG. 2 is a cross-sectional view of an LED of U.S. Pat. No. 6,797,987.
Figure 3:
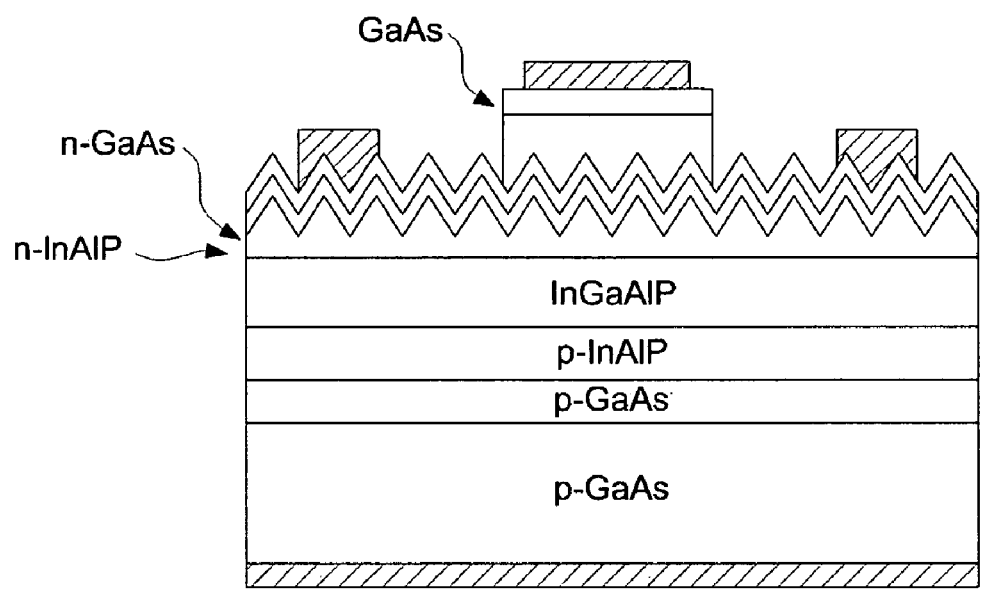
FIG. 3 is a cross-sectional view of an LED of U.S. Pat. No. 6,900,473.

The AlInGaP semiconductor LED is, in general, grown on the GaAs substrate. GaAs substrate is a light-absorbing substrate that will absorb most of the light emitted from the active layer toward the substrate. The present invention employs a wafer bonding method to replace GaAs substrate with a permanent thermal and electrical conductive substrate. With the disclosed chip structures, light from the active layer will be reflected instead of absorbed by substrate. As a mechanical support to the epi layers, the bonding quality plays a very important role to the production yield. As a result, the chosen bonding process dramatically affects the cost of production. The aforementioned "Fusion Bonding" provides an excellent strength for the bonding interface due to its high bonding temperature and high bonding pressure. However, it is rather difficult to obtain a stable forward voltage with the above-mentioned technology. It is possibly a potential barrier at the bonding interface will be generated if these high temperature/high pressure process conditions are not well controlled. On the other hand, "Eutectic Bonding" is conducted at lower temperature and lower pressure. However, the intermetallic material formed by eutectic bonding, such as Au/Sn, is usually comparatively brittle. It draws concerns that the bonding strength is not strong enough to survive the outdoor operating environments.

The present invention employ "Diffusion Bonding" that will require a moderate bonding pressure (50~500 kg/cm$^2$) and bonding temperature (400~700° C.) to carry out the wafer bonding process. Materials suitable for this process have a melting point from 600° C. to 1400° C. For the processing conditions, it is required to have a bonding temperature higher than half of the melting point value of the selected material and have a bonding pressure larger than 50 kg/cm$^2$ to maintain the perfect contact condition between two bonding materials. The resulted bonding strength of the interface will be closed to bulk module of bonding metal. The bonding metal can be selected from the following table.

| Bonding Material | Melting Point ($T_m$, °C.) | ½ Melting Point ($T_m$, °C.) | Bulk Module (GPa) |
|---|---|---|---|
| Copper (Cu) | 1038 | 519 | 140 |
| Silver (Ag) | 962 | 481 | 100 |
| Gold (Au) | 1064 | 532 | 220 |
| Aluminum (Al) | 660 | 330 | 26 |

In addition to the above-mentioned pure metals used for diffusion bonding, one can also selects these metals with lightly doped Zn, Ge and Be, such as Au—Zn, Au—Ge, Au—Be alloys, to lower its bonding temperature. Other Au alloys are also suggested. The suggested bonding pressure range is from 50 kg/cm² to 500 kg/cm².

After these two wafers of dissimilar material (epi wafer and permanent substrate) are bonded, it is also required to form an ohmic contact on the first confinement layer after the temporary substrate being removed. This ohmic contact is subjected to a high temperature thermal annealing process, normally 400~600° C. Owing to the inconsistency of thermal expansion coefficients between dissimilar materials, a high thermal strain between the epi wafer and permanent substrate is created. The active layer is very sensitive to the stress conditions such that the residual stress level in the epi wafer should be considered. The thickness of the permanent substrate, epitaxial structure 20, and metal diffusion bonding layer 40, are generally from 75 μm to 200 μm, less than 20 μm, and less than 5 μm, respectively. By analyzing the thickness of each layer, it is found that the main source of residual stresses caused by the diffusion bonding process will come from the mismatch of thermal expansion coefficients between the permanent substrate and epi layers. The stresses caused from the diffusion bonding layer can be neglected because it is very thin. By far, we can conclude that the CTE selection of permanent substrate plays a very important role to the reliability issues.

The coefficients of thermal expansion α (CTE) for various materials are listed in the following table.

| Material | $\alpha \times 10^{-6} K^{-1}$ |
|---|---|
| Epitaxial structure (Layer 21~23) | 5.5 |
| GaP Substrate | 5.8 |
| Mo Substrate | 4.9 |
| GaAs Substrate | 6.4 |
| Si Substrate | 2.6 |

As described in the table, the present invention recommends that GaP, GaAs or Mo (molybdenum) can be used as the permanent substrate. Although GaAs and Mo are light-absorbing substrates, light from active layer can be reflected by the mirror structure on top of permanent substrate to prevent absorption. In consideration of CTE, both of them can still be selected.

After the permanent substrate 30 and metal diffusion bonding layer 40 are selected, the manufacturing method in accordance with the present invention is described in the following steps.

Figure 4:
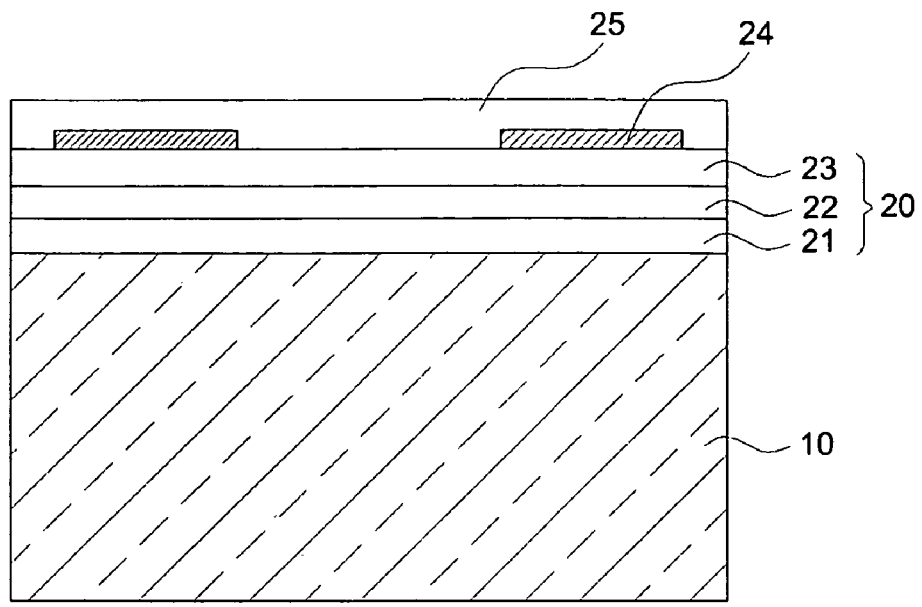
FIG. 4 is a cross-sectional view of a semiconductor epitaxial structure with the insulating transparent current block layer and ohmic contact metal layer on top.

Referring to FIG. 4 for the manufacturing process of a light emitting diode according to a preferred embodiment of the present invention, an n-type gallium arsenide (GaAs) is used as a temporary substrate 10. The material of the temporary substrate 10 is not limited to GaAs. An AlInGaP semiconductor epitaxial structure 20 is formed onto the substrate 10 by the MOVCD process. In this embodiment, the semiconductor epitaxial structure 20 includes an n-type first confinement layer 21, an active light emitting layer 22 on the first confinement layer 21, and a p-type second confinement layer 23 formed on the active light emitting layer 22. The first confinement layer 21 is preferably made of n-AlInGaP or n-AlInP, and the second confinement layer 23 is preferably made of p-AlInGaP or p-AlInP, and the active lighting-emitting layer 22 is preferably made of AlInGaP. In another preferred embodiment, the active light emitting layer 22 is formed by a traditional multiple quantum well (MQW) structure.

According to the FIG. 4, the embodiment of the current invention has a design of vertical structure. It is required that an ohmic contact metal layer 25 must be deposited on the second confinement layer 23. Nevertheless, any high temperature process condition applied on this ohmic contact metal layer could destroy the reflectivity at the metal semiconductor interface. It is desired to insert a patterned insulating transparent layer 24 in-between the second confinement layer 23 and ohmic contact metal layer 25. The material could be selected from $SiO_2$, $Al_2O_3$, or $SiN_x$ to prevent any damage on the surface of the second confinement layer. Besides this function, layer 24 also serves as a current blocking layer by only covering the selected area. By this way, the current can be spread out and the light emitted from active layer 22 can be reflected effectively.

Figure 5:
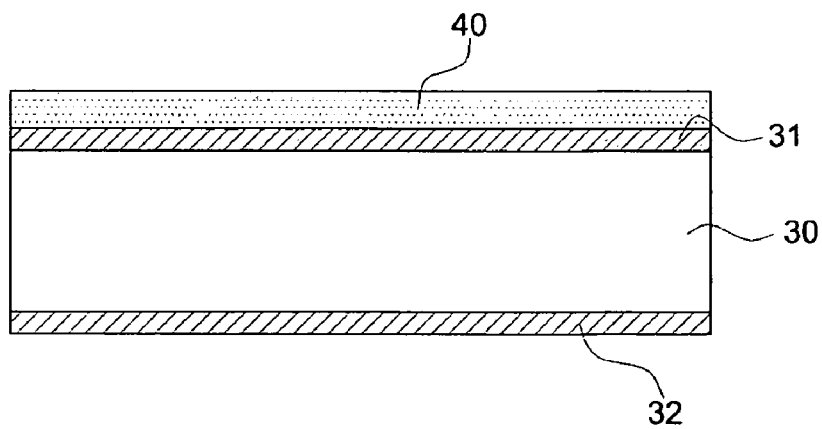
FIG. 5 is a cross-sectional view of a permanent substrate of the present invention ready for bonding.

Referring to FIG. 5, a conducting permanent substrate 30 is provided. The material of this substrate could be selected from GaP, GaAs or Mo. The thickness could be in the range of 75~200 μm. The permanent substrate consists of one ohmic contact metal layer 31 on top surface of the substrate and the other electrode 32 on bottom surface of the substrate for current conduction.

Furthermore, a metal diffusion bonding layer 40 is deposited on top of the ohmic contact metal layer 31. The material of this metal diffusion bonding layer could be selected from Au, Cu, Ag, or Al. In addition, the metal diffusion bonding layer 40 could also be deposited on the surface of ohmic contact metal layer 25 of the semiconductor wafer.

Figure 6:
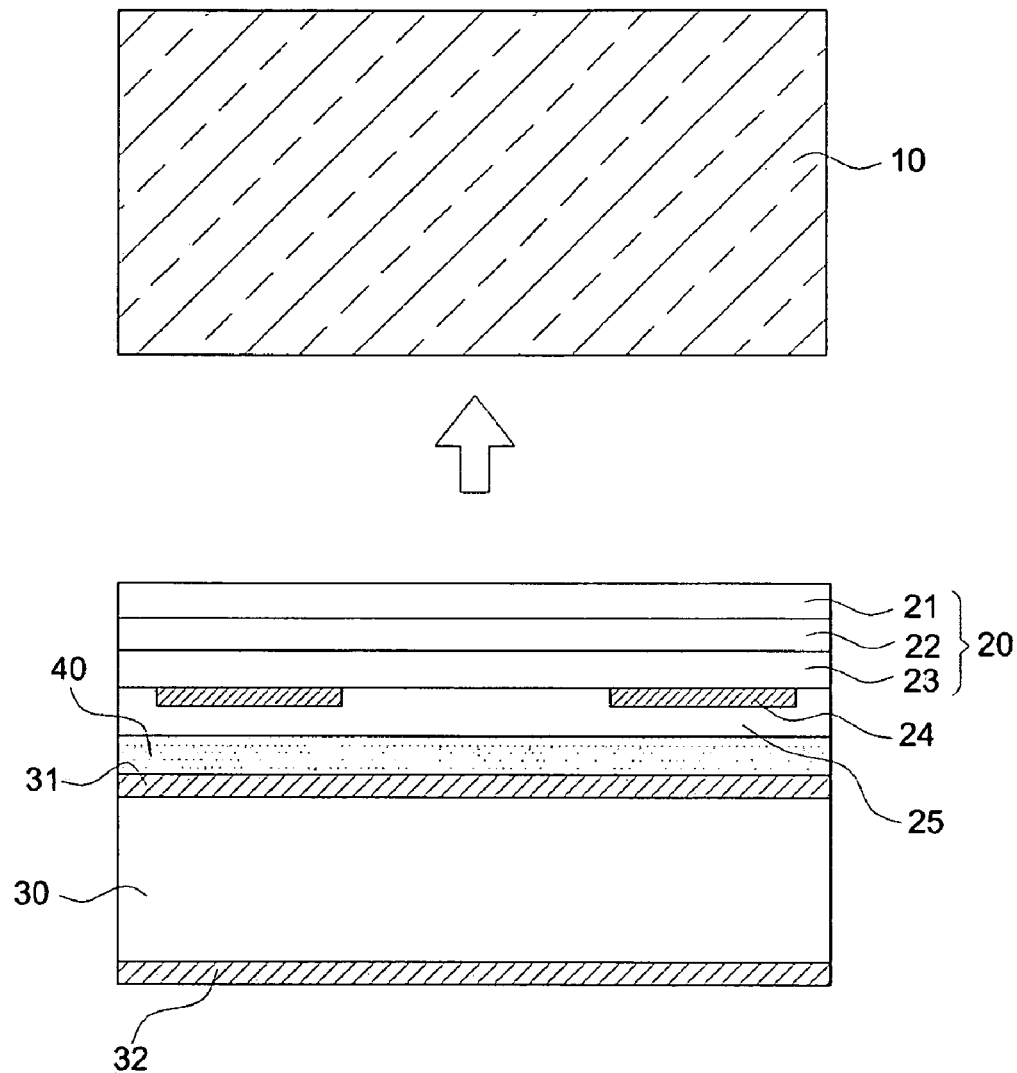
FIG. 6 is a cross-sectional view of the bonded wafer after removing the temporary substrate according to the present invention.

A diffusion bonding process is performed for the two above-mentioned wafers under specific temperature condition (400° C.~700° C.) and pressure condition (50~500 kg/cm²). The temporary substrate 10 is then removed from the bonded wafers as shown in FIG. 6.

Figure 7:
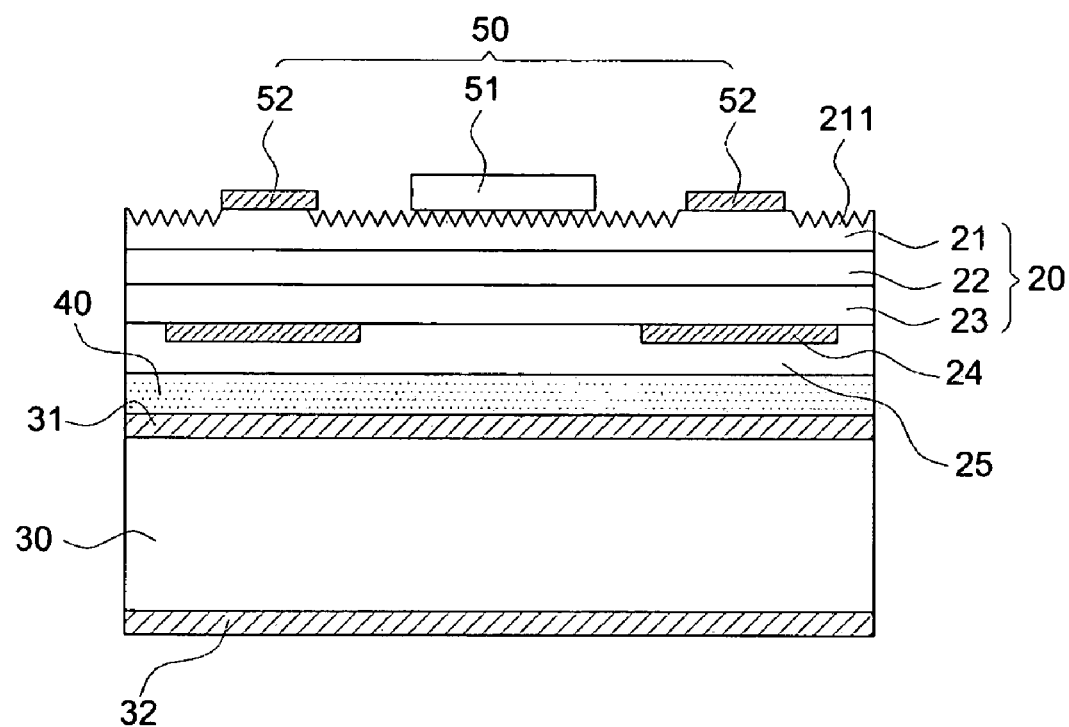
FIG. 7 is a cross-sectional view of a completed LED chip by using a diffusion bonding process and surface roughing process according to the present invention.

Referring to FIG. 7, a composite electrode 50 is formed on top of the first confinement layer, i.e. the n-AlInGaP layer. Composite electrode 50 consists of a bonding pad 51 in the center and a set of ohmic contacts 52 of the first conducting type surrounding and connected to the bonding pad. The preferred embodiment will optimize the geometric shapes and relative positions of both the ohmic contacts 52 and the insulating transparent layer 24 to define a corresponding current flow path. Thus, under normal operating condition, a Schottky barrier is formed between bonding pad 51 and the first confinement layer to provide good current blocking effect. The injection current is fed into LED through ohmic contacts 52 and then forced to flow horizontally into active region by the transparent insulating current block layer 24.

Figure 8:
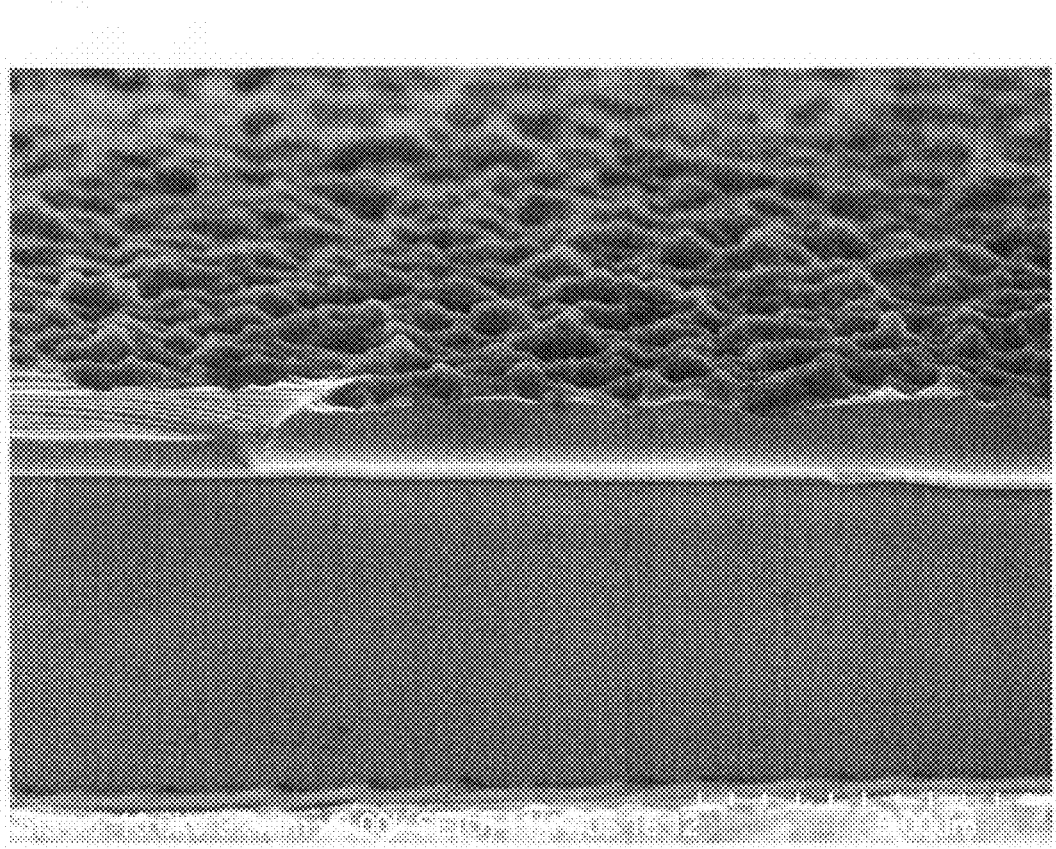
FIG. 8 is an SEM picture of the roughened surface according to the present invention.

However, the light generated from the active layer 22 emits in all directions. In order to enhance the extraction efficiency, another characteristic of the current invention is to increase the surface roughness of the light-emitting surface (first confinement layer of the AlInGaP epi-structure). The procedure is to perform the heat treatment (400° C.~600° C.) on the bonded wafer with ohmic contact metal layer on the first confinement layer. The ohmic contact metal could be Au-Zu, Au—Be, Au—Ge, or Au—Sn alloy. The ohmic contact metal is diffused into the first confinement layer 21 (n-AlInGaP or n-AlInP) and form discontinuous metal clusters. These metal clusters act as micro masks while apply wet chemical etching (with etching solution $NH_4OH:H_2O_2:H_2O=2:1:5$ or $H_2SO_4:H_2O_2:H_2O=1:1:10$) to the first confinement layer 21. These metal clusters and etching residues can be removed by using ultrasonic cleaner later. FIG. 7 shows the roughened surface 211. FIG. 8 shows the SEM image of this surface. By this method, the brightness level can be increased up to 50%~70% which is about twice effective than the traditional etching method.

Therefore, the present invention applies diffusion bonding technology by using specific bonding metal to bond two different wafers together. Compared with "Fusion Bonding" and "Eutectic Bonding", diffusion bonding has the advantages of better production yield and reliability, respectively. This invention also develops a surface treatment process based on metal diffusion and wet chemical etching to improve light extraction efficiency.

Many changes and modifications in the above-mentioned embodiments of the invention can, of course, be carried out without departing from the scope thereof. Accordingly, to promote the progress in science and the useful arts, the invention is disclosed and is intended to be limited only by the scope of the appended claims.

What is claimed is:

1. A light emitting diode by using metal diffusion bonding technology, comprising:
   a) a conducting permanent substrate formed on a second type of electrode;
   b) an ohmic contact metal layer formed on the permanent substrate;
   c) a metal diffusion bonding layer with a thickness less than 5 µm is formed on the ohmic contact metal layer;
   d) a second ohmic contact metal layer formed on the metal diffusion bonding layer;
   e) an AlInGaP semiconductor LED epitaxial structure formed on the second ohmic contact metal layer, a rough surface being formed on the top of the first confinement layer of semiconductor LED epitaxial structure;
   f) an transparent insulating current block layer with special pattern interposed between the second ohmic contact metal layer and the second confinement layer of AlInGaP semiconductor epitaxial structure to maintain the reflectivity and control current flow; and
   g) a composite electrode that consists of a center bonding pad and a set of ohmic contacts of the first conducting type formed on a partial surface of the first confinement layer of AlInGaP semiconductor epitaxial structure to ensure the current flow path.

2. The light emitting diode by using metal diffusion bonding technology as recited in claim 1, wherein the conducting permanent substrate is made from a material selected from a group consisting of gallium phosphide (GaP), gallium arsenide (GaAs), and molybdenum (Mo), and wherein the conducting permanent substrate has a thickness of 75~200 µm.

3. The light emitting diode by using metal diffusion bonding technology as recited in claim 1, wherein the metal diffusion bonding layer is made from a material selected from a group consisting of gold (Au), copper (Cu), silver (Ag), aluminum (Al), gold-zinc (Au—Zn) alloy, gold-germanium (Au—Ge) alloy, and gold-beryllium (Au—Be) alloy, and wherein the metal.

4. The light emitting diode by using metal diffusion bonding technology as recited in claim 1, wherein the transparent insulating layer is made from a material selected from a group consisting of $SiO_2$, $Al_2O_3$ and $SiN_x$ series.

5. The light emitting diode by using metal diffusion bonding technology as recited in claim 1, wherein the AlInGaP semiconductor epitaxial structure has a thickness of less than 20 µm, and wherein the epitaxial structure includes:
   a) a first confinement layer of the first conducting type formed on the surface of the temporary substrate;
   b) an active layer formed on the surface of the first confinement layer; and
   c) a second confinement layer of the second conducting type formed on the surface of the active layer.

6. The light emitting diode by using metal diffusion bonding technology as recited in claim 5, wherein the first confinement layer is either n-type aluminum indium gallium phosphide (n-AlInGaP) or n-type aluminum indium phosphide (n-AlInP).

7. The light emitting diode by using metal diffusion bonding technology as recited in claim 5, wherein the second confinement layer is either p-type aluminum indium gallium phosphide (n-AlInGaP) or p-type aluminum indium phosphide (n-AlInP).

8. The light emitting diode by using metal diffusion bonding technology as recited in claim 5, wherein the temporary substrate is n-type gallium arsenide (n-GaAs).

9. The light emitting diode by using metal diffusion bonding technology as recited in claim 1, wherein the composite electrode includes a bonding pad in the center and a set of ohmic contacts of the first conducting type surrounding and connected to the bonding pad.

* * * * *